US010622933B2

(12) United States Patent
Tsubamoto et al.

(10) Patent No.: US 10,622,933 B2
(45) Date of Patent: Apr. 14, 2020

(54) INVERTER DEVICE THAT REDUCES A LOSS CAUSED BY SWITCHING ELEMENTS

(71) Applicant: AISIN AW CO., LTD., Anjo-shi, Aichi-ken (JP)

(72) Inventors: Shinsuke Tsubamoto, Hekinan (JP); Isamu Kato, Nishio (JP)

(73) Assignee: AISIN AW CO., LTD., Anjo (JP)

( * ) Notice: Subject to any disclaimer, the term of this patent is extended or adjusted under 35 U.S.C. 154(b) by 0 days.

(21) Appl. No.: 16/078,943

(22) PCT Filed: Mar. 3, 2017

(86) PCT No.: PCT/JP2017/008510
§ 371 (c)(1),
(2) Date: Aug. 22, 2018

(87) PCT Pub. No.: WO2017/163820
PCT Pub. Date: Sep. 28, 2017

(65) Prior Publication Data
US 2019/0058388 A1  Feb. 21, 2019

(30) Foreign Application Priority Data
Mar. 23, 2016  (JP) .................... 2016-058909

(51) Int. Cl.
*H02P 29/024* (2016.01)
*H02M 7/797* (2006.01)
(Continued)

(52) U.S. Cl.
CPC .......... *H02P 29/032* (2016.02); *H02M 7/797* (2013.01); *H02P 29/026* (2013.01); *H02M 2001/0009* (2013.01)

(58) Field of Classification Search
CPC ... H02M 2001/0048–0058; H02M 2001/0009; H02M 7/02–40;
(Continued)

(56) References Cited
U.S. PATENT DOCUMENTS

2009/0121684 A1* 5/2009 Hussain ................ H02J 7/0055
320/139
2012/0320649 A1* 12/2012 Hamanaka .............. H02M 7/48
363/131
(Continued)

FOREIGN PATENT DOCUMENTS

JP      H02-61981 A      3/1990
JP      2012-151592 A    8/2012
(Continued)

OTHER PUBLICATIONS

May 16, 2017 International Search Report issued in International Patent Application PCT/JP2017/008510.

*Primary Examiner* — Gary L Laxton
*Assistant Examiner* — Peter M Novak
(74) *Attorney, Agent, or Firm* — Oliff PLC

(57) ABSTRACT

An inverter device that includes an inverter circuit that converts power between DC power and multi-phase AC power; a drive circuit that transfers a drive signal to each of a plurality of switching elements that form the inverter circuit to cause a switching element of the plurality of switching elements to perform turn-on, in which the switching element is caused to transition from an off state to an on state, and turn-off, in which the switching element is caused to transition from the on state to the off state; and a current detection circuit that detects a current that flows through each of the plurality of switching elements.

4 Claims, 4 Drawing Sheets

(51) Int. Cl.
*H02P 29/032* (2016.01)
*H02M 1/00* (2006.01)

(58) Field of Classification Search
CPC ..... H02M 7/66–98; H03K 17/163–164; H02P 29/026–032
See application file for complete search history.

(56) References Cited

U.S. PATENT DOCUMENTS

2016/0322927 A1* 11/2016 Merkel .................... B60L 3/04
2016/0352262 A1* 12/2016 Kataoka ............... H02P 29/032
2017/0194954 A1* 7/2017 Chen .................. H03K 17/0826

FOREIGN PATENT DOCUMENTS

| | | |
|---|---|---|
| JP | 2014-75694 A | 4/2014 |
| JP | 2014-117112 A | 6/2014 |
| JP | 2015-216839 A | 12/2015 |

* cited by examiner

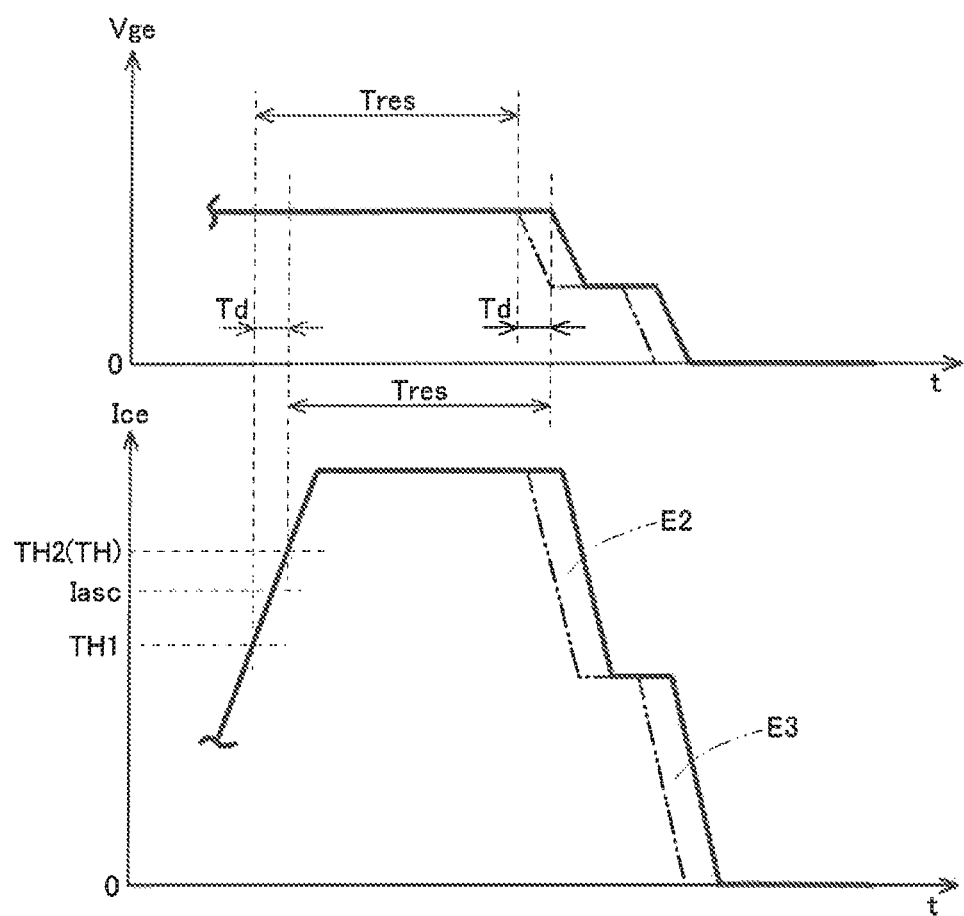

INVERTER DEVICE THAT REDUCES A LOSS CAUSED BY SWITCHING ELEMENTS

BACKGROUND

The present disclosure relates an inverter device that includes an inverter circuit that converts power between DC power and multi-phase AC power.

Switching elements that constitute an inverter circuit that converts power between DC power and AC power are often provided with a drive signal from a control device via a drive circuit. The switching elements are controlled so as to perform turn-on, in which the switching elements are brought from an off state into an on state, and turn-off, in which the switching elements are brought from the on state into the off state, on the basis of the drive signal. In the case where a current that exceeds a reference flows through the switching elements in the on state (in the case of an overcurrent state), the switching elements are controlled to the off state by the control device or the drive circuit. For example, Japanese Patent Application Publication No. 2012-151592 identified below describes a feature wherein a gate voltage of IGBTs (insulated gate bipolar transistors) is turned off (0 V) in the case where an overcurrent flows because of a short circuit or the like (see paragraphs [0027], [0030], [0032], etc.).

When the switching elements are abruptly turned off with a large current flowing therethrough, however, a significantly high surge voltage may be generated to significantly damage the switching elements. Therefore, soft turn-off (soft switching) in which the transition time of the turn-off is extended by making variations in drive signal slow is occasionally performed. In the soft turn-off, however, a current that flows through the switching elements is decreased at a reduced speed since the transition time is extended. Therefore, the switching elements tend to consume large energy (loss, heat) compared to the normal turn-off.

SUMMARY

An exemplary aspect of the disclosure provides a technique for reducing a loss caused by switching elements when the switching elements are turned off along with generation of an overcurrent.

In view of the above, an aspect provides an inverter device that includes an inverter circuit that converts power between DC power and multi-phase AC power; a drive circuit that transfers a drive signal to each of a plurality of switching elements that form the inverter circuit to cause a switching element of the plurality of switching elements to perform turn-on, in which the switching element is caused to transition from an off state to an on state, and turn-off, in which the switching element is caused to transition from the on state to the off state; and a current detection circuit that detects a current that flows through each of the plurality of switching elements, in which: the drive circuit includes a soft turn-off circuit that causes the switching element to perform the turn-off by transferring the drive signal via a delay resistor in the case where the current which is detected by the current detection circuit is equal to or more than an overcurrent threshold prescribed in advance; and the soft turn-off circuit includes a capacitor connected in parallel with the delay resistor.

According to this configuration, in which the soft turn-off circuit is provided, the magnitude of a surge voltage generated in the switching elements when the switching elements are turned off along with generation of an overcurrent can be suppressed. With the soft turn-off circuit provided with the capacitor, in addition, a charge accumulated in the stray capacitance of the switching elements can be discharged by the capacitor during the turn-off. That is, the drive signal for the switching elements can be caused to transition immediately by the action of the capacitor in the initial stage of the transition while allowing the drive signal to transition slowly because of the delay resistor of the soft turn-off circuit. In the initial stage of the transition, a large current flows through the switching elements. Thus, the energy (loss, heat) due to the current which flows through the switching elements can be reduced by causing the drive signal to transition immediately. According to the present configuration, in this way, a loss caused by the switching elements when the switching elements are turned off along with generation of an overcurrent can be reduced.

Further characteristics and advantages of the inverter device will become clear from the following description of an embodiment made with reference to the drawings.

BRIEF DESCRIPTION OF THE DRAWINGS

FIG. 6 includes waveform charts schematically illustrating a comparative example of the gate voltage and the element current at the time of turn-off.

DETAILED DESCRIPTION OF EMBODIMENTS

Figure 1:
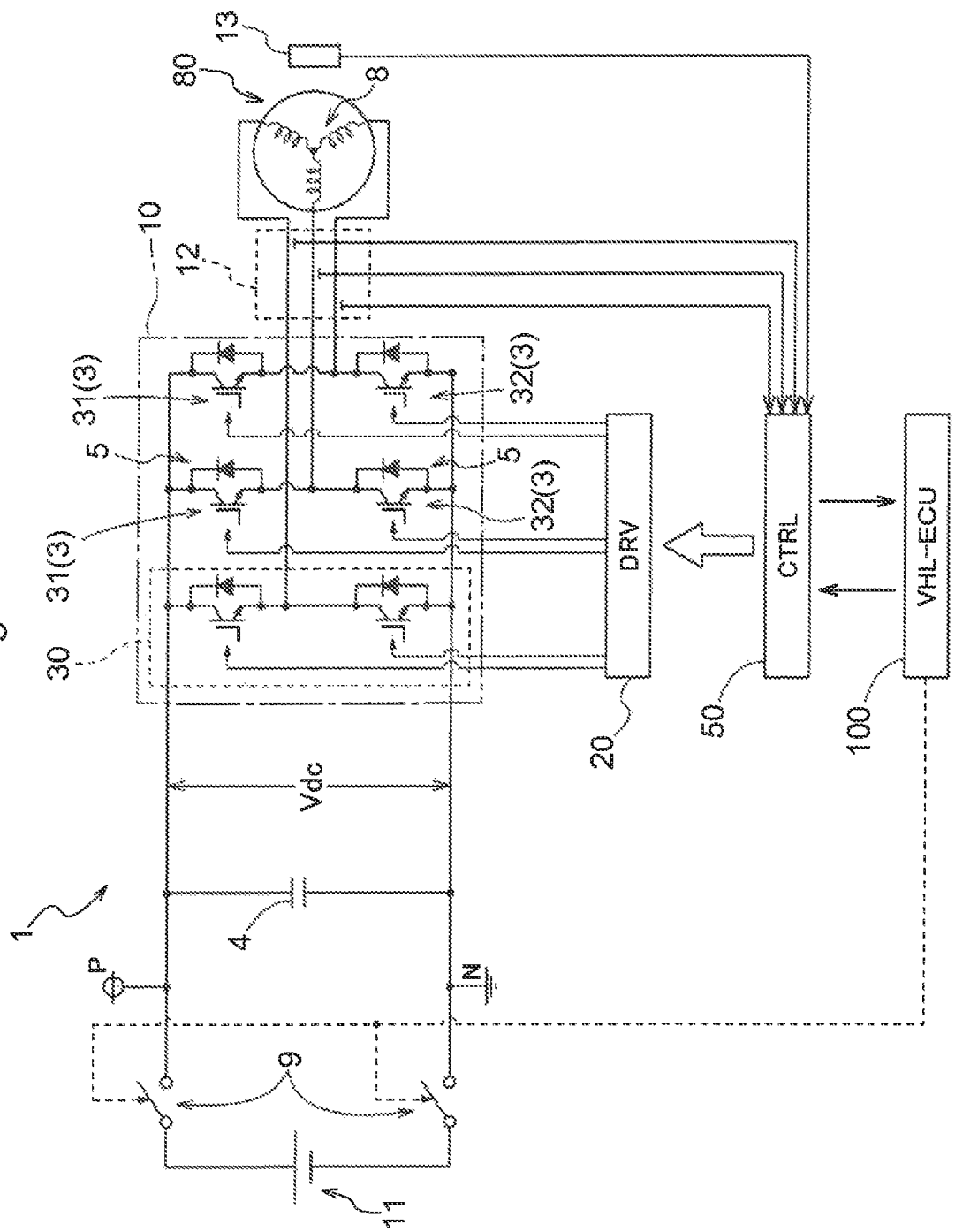
FIG. 1 is a circuit block diagram schematically illustrating the configuration of an inverter device.

An inverter device 1 according to an embodiment will be described below with reference to the drawings. As illustrated in FIG. 1, the inverter device 1 includes an inverter circuit 10 that converts power between DC power and multi-phase AC power. In the present embodiment, the inverter circuit 10 is connected to an AC rotary electric machine 80 and a high-voltage battery 11 (DC power source) to convert power between multi-phase AC power and DC power. The inverter circuit 10 is connected to the high-voltage battery 11 via a contactor 9, and connected to the AC rotary electric machine 80 to convert power between DC power and multi-phase AC power (here, three-phase AC power). The inverter circuit 10 includes a plurality of (here, three) arms 30, each of which corresponds to one phase of AC power and is constituted of a series circuit that includes an upper switching element 31 and a lower switching element 32.

The rotary electric machine 80 can be used as a drive force source for a vehicle such as a hybrid vehicle and an electric vehicle, for example. In addition, the rotary electric machine 80 can function as both an electric motor and an electric generator. The rotary electric machine 80 converts electric power supplied from the high-voltage battery 11 via the inverter circuit 10 into power for driving wheels of the vehicle (power running). Alternatively, the rotary electric machine 80 converts a rotational drive force transferred from an internal combustion engine (not illustrated) or the wheels into electric power for charging the high-voltage battery 11 via the inverter circuit 10 (regeneration). The high-voltage battery 11 is constituted of a secondary battery (battery) such as a nickel-hydrogen battery or a lithium-ion battery, an electric double layer capacitor, or the like. In the case where the rotary electric machine 80 is a drive force source for the vehicle, the high-voltage battery 11 is a high-voltage high-capacity DC power source, and has a rated power source voltage of 200 to 400 [V], for example.

Hereinafter, the voltage between a positive power source line P and a negative power source line N on the DC side of the inverter circuit 10 will be referred to as a DC link voltage Vdc. A smoothing capacitor (DC link capacitor 4) that smoothes the DC link voltage Vdc is provided on the DC side of the inverter circuit 10. The DC link capacitor 4 stabilizes a DC voltage (DC link voltage Vdc) that fluctuates in accordance with fluctuations in power consumption of the rotary electric machine 80.

As illustrated in FIG. 1, the contactor 9 is provided between the high-voltage battery 11 and the inverter circuit 10. Specifically, the contactor 9 is disposed between the DC link capacitor 4 and the high-voltage battery 11. The contactor 9 can interrupt the electrical connection between the electrical circuit system (the DC link capacitor 4 and the inverter circuit 10) of the inverter device 1 and the high-voltage battery 11. That is, the inverter circuit 10 is connected to the rotary electric machine 80, and connected to the high-voltage battery 11 via the contactor 9. When the contactor 9 is in a connected state (closed state), the high-voltage battery 11 and the inverter circuit 10 (and the rotary electric machine 80) are electrically connected to each other. When the contactor 9 is in a disconnected state (open state), the electrical connection between the high-voltage battery 11 and the inverter circuit 10 (and the rotary electric machine 80) is interrupted.

In the present embodiment, the contactor 9 is a mechanical relay that opens and closes on the basis of an instruction from a vehicle ECU (electronic control unit) 100 (VHL-ECU) which is one of high-level control devices in the vehicle, and is referred to as a system main relay (SMR), for example. The contactor 9 is brought into a conductive state (connected state) with contacts of the relay closed when an ignition key (IG key) of the vehicle is in an on state (effective state), and brought into a non-conductive state (disconnected state) with the contacts of the relay open when the IG key is in an off state (ineffective state).

Figure 2:
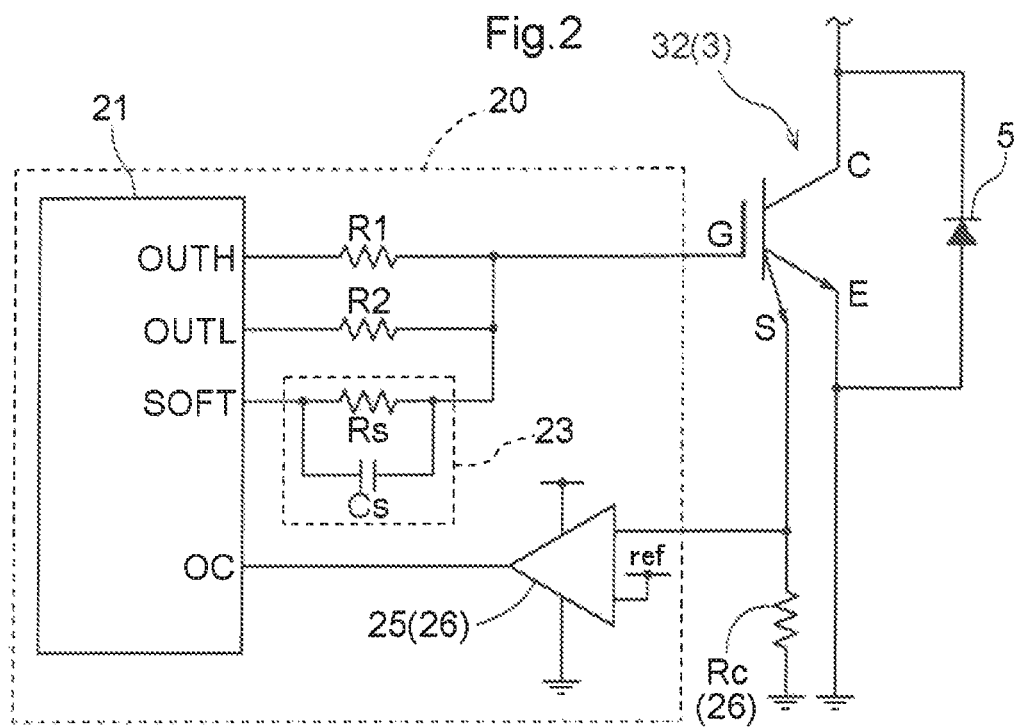
FIG. 2 is a circuit block diagram schematically illustrating an example of a drive circuit.

As discussed above, the inverter circuit 10 converts DC power having the DC link voltage Vdc into AC power with multiple phases (n phases with n being a natural number; here, three phases) to supply the AC power to the rotary electric machine 80, and converts AC power generated by the rotary electric machine 80 into DC power to supply the DC power to the DC power source. The inverter circuit 10 is configured to have a plurality of switching elements 3. The switching elements 3 are preferably power semiconductor elements that can operate at a high frequency, such as IGBTs (insulated gate bipolar transistors), power MOSFETs (metal oxide semiconductor field effect transistors), SiC-MOSFETs (silicon carbide-metal oxide semiconductor FETs), SiC-SITS (SiC-static induction transistors), and GaN-MOSFETs (gallium nitride-MOSFETs). In the present embodiment, as illustrated in FIG. 1, IGBTs are used as the switching elements 3. As illustrated in FIG. 2, the switching elements 3 each include a collector terminal C, an emitter terminal E, and a gate terminal G (control terminal).

The inverter circuit 10 which converts power between DC power and multi-phase AC power, for example, is constituted of a bridge circuit that has a number of arms 30, the number corresponding to the number of the multiple phases, as is well known. That is, as illustrated in FIG. 1, two switching elements 3 are connected in series between the DC positive side (positive power source line P) and the DC negative side (negative power source line N) of the inverter circuit 10 to constitute one arm 30. In the case of three-phase AC power, three such series circuits (each corresponding to one arm 30) are connected in parallel (to form three phases). That is, a bridge circuit in which a set of series circuits (arms 30) corresponds to each of stator coils 8 of the rotary electric machine 80 corresponding to U-phase, V-phase, and W-phase is constituted.

The middle point of each arm 30, that is, the point of connection between the switching element 3 on the positive power source line P side (upper switching element 31) and the switching element 3 on the negative power source line N side (lower switching element 32), is connected to each of the stator coils 8 of the rotary electric machine 80 for three phases. A freewheeling diode 5 is provided in parallel with each of the switching elements 3 with the direction from the negative pole "N" toward the positive pole "P" (the direction from the lower side toward the upper side) defined as the forward direction.

As illustrated in FIG. 1, the inverter circuit 10 is controlled by an inverter control device 50 (CTRL). The inverter control device 50 is constructed of a logic circuit such as a microcomputer as a core member. For example, the inverter control device 50 controls the rotary electric machine 80 via the inverter circuit 10 by performing current feedback control using a vector control method on the basis of target torque for the rotary electric machine 80 provided as a request signal from another control device or the like such as the vehicle ECU 100. Actual currents that flow through the stator coils 8 of the rotary electric machine 80 for the respective phases are detected by a current sensor 12, and the inverter control device 50 acquires the detection result. In addition, the magnetic pole position of the rotor of the rotary electric machine 80 at each time point is detected by a rotation sensor 13 such as a resolver, for example, and the inverter control device 50 acquires the detection result. The inverter control device 50 executes current feedback control using the detection result of the current sensor 12 and the rotation sensor 13. The inverter control device 50 is configured to have a variety of functional sections for the current feedback control, which are each implemented through cooperation between hardware such as a microcomputer and software (program). The current feedback control is known, and thus is not described in detail herein.

Control terminals of the switching elements 3 (e.g. the gate terminals G of the IGBTs) which constitute the inverter circuit 10 are connected to the inverter control device 50 via a drive circuit 20 (DRV) to be individually subjected to switching control. The vehicle ECU 100 and the inverter control device 50 which generates a switching control signal are constituted of a microcomputer or the like as a core component, and have an operating voltage (a power source voltage for the circuit) that is significantly different from that of a high voltage-system circuit that drives the rotary electric machine 80. Many vehicles include not only the high-voltage battery 11 but also a low-voltage battery (not illustrated) that serves as a power source at a low voltage (e.g. 12 to 24 [V]) compared to the high-voltage battery 11. The operating voltage of the vehicle ECU 100 and the inverter control device 50 is 5 [V] or 3.3 [V], for example, and the vehicle ECU 100 and the inverter control device 50 are supplied with power from the low-voltage battery to operate.

Therefore, the inverter device 1 is provided with the driver circuit 20 which relays a switching control signal (a gate drive signal (drive signal) in the case of the IGBTs) for each of the switching elements 3 with the drive capability (e.g. the capability to cause the following circuit to operate, such as the voltage amplitude and the output current) of the gate drive signal (drive signal) enhanced. A drive signal generated by the inverter control device 50 which is a low voltage-system circuit is supplied to the inverter circuit 10 as a drive signal for the high voltage-system circuit via the drive circuit 20. The low voltage-system circuit and the high voltage-system circuit are often isolated from each other. In this case, the drive circuit 20 is constituted utilizing an insulating element such as a photocoupler and a transformer and a driver IC, for example.

FIG. 2 illustrates an example of the drive circuit 20. FIG. 2 illustrates an example of the configuration of the drive circuit 20 for one switching element 3. The drive circuit 20 is constituted of a driver IC 21 as a core component. The driver IC 21 includes three output terminals (OUTH, OUTL, and SOFT) connected in a wired-OR manner to the gate terminal G of the switching element 3. When a signal is output from one of the three output terminals, the other two output terminals are in a high-impedance (HiZ) state.

The OUTH terminal is a terminal that outputs a drive signal in a high state. This drive signal turns on the switching element 3 in the off state into the on state, and continues the high state to maintain the switching element 3 in the on state. The OUTL terminal is a terminal that outputs a drive signal in a low state. This drive signal turns off the switching element 3 in the on state into the off state, and continues the low state to maintain the switching element 3 in the off state. The OUTH terminal is connected to the gate terminal G of the switching element via a first damping resistor R1. The OUTL terminal is connected to the gate terminal G of the switching element 3 via a second damping resistor R2.

The SOFT terminal is a terminal that outputs a drive signal in a low state as with the OUTL terminal. It should be noted, however, that the SOFT terminal is connected to the gate terminal G of the switching element 3 via a delay resistor Rs (soft turn-off resistor) with a resistance value that is larger than those of the first damping resistor R1 and second damping resistor R2. Therefore, the transition time of a gate voltage Vge (gate-emitter voltage) is extended in the case where a drive signal output from the SOFT terminal compared to a case where a drive signal is output from the OUTL terminal. As a result, the transition time of turn-off of the switching element 3 is also extended, which achieves so-called soft turn-off (soft switching). A capacitor Cs is connected in parallel with the delay resistor Rs. The capacitor Cs will be discussed later.

The switching element 3 also has a sense terminal S that detects a current (element current; collector-emitter current Ice) that flows through the switching element 3. A current with a value of several hundredths to thousandths that of the collector-emitter current Ice and proportional thereto flows through the sense terminal S. A shunt resistor Rc is connected in series with the sense terminal S. The collector-emitter current Ice is detected by detecting a terminal voltage of the shunt resistor Rc.

The drive circuit 20 includes an overcurrent determination circuit 25 that compares the terminal voltage of the shunt resistor Rc and a reference voltage ref and that determines that an overcurrent is flowing in the case where the terminal voltage is equal to or more than the reference voltage ref. In the present embodiment, the overcurrent determination circuit 25 outputs a signal in the high state in the case where it is determined that an overcurrent is flowing, and outputs a signal in the low state in the case where it is determined that an overcurrent is not flowing. The detection result of the overcurrent determination circuit 25 is input to an OC terminal of the driver IC 21. The driver IC 21 outputs a drive signal in the low state in the case where the overcurrent determination circuit 25 determines that an overcurrent is flowing through the switching element 3. The shunt resistor Rc and the overcurrent determination circuit 25 can be considered as an overcurrent detection circuit 26 that detects whether or not an overcurrent is flowing through the switching element 3. In addition, the reference voltage ref which is used by the overcurrent determination circuit 25 corresponds to an overcurrent threshold.

When the switching element 3 is abruptly turned off in the case where the element current (collector-emitter current Ice) of the switching element 3 is large, a high surge voltage may be generated in a collector-emitter voltage Vce of the switching element 3. Such a surge voltage may damage the switching element 3, and reduce the life of the switching element 3. The surge voltage can be suppressed by making the transition during the turn-off slow. Therefore, in the case where an overcurrent is generated, soft turn-off (soft switching) is executed by outputting a drive signal from the SOFT terminal, which outputs a drive signal with a long transition time compared to a case where a drive signal is output from the OUTL terminal.

In the soft turn-off, however, the collector-emitter current Ice is decreased slowly, and the energy (loss, heat) due to the current (Ice) is increased. Thus, the drive circuit 20 includes a soft turn-off circuit 23 that has the delay resistor Rs which achieves soft turn-off and the capacitor Cs which is connected in parallel with the delay resistor Rs in order to reduce the loss during the turn-off. The function of the capacitor Cs will be described below.

The gate terminal G of the switching element 3 has a stray capacitance. Therefore, during the turn-on, a charge for charging the stray capacitance is required, and the transition time is extended by such charging. During the turn-off, meanwhile, it is necessary to discharge the charge in the stray capacitance, and the transition time is extended by such discharging. The capacitor Cs, which is connected in parallel with the delay resistor Rs, discharges the charge of the gate terminal G during the turn-off. That is, the soft turn-off circuit 23 achieves the soft turn-off by extending the transition time of the gate voltage Vge using the delay resistor Rs, and shortens the transition time of the gate voltage Vge by discharging the charge (Qg) of the gate voltage G using the capacitor Cs.

Figure 3:
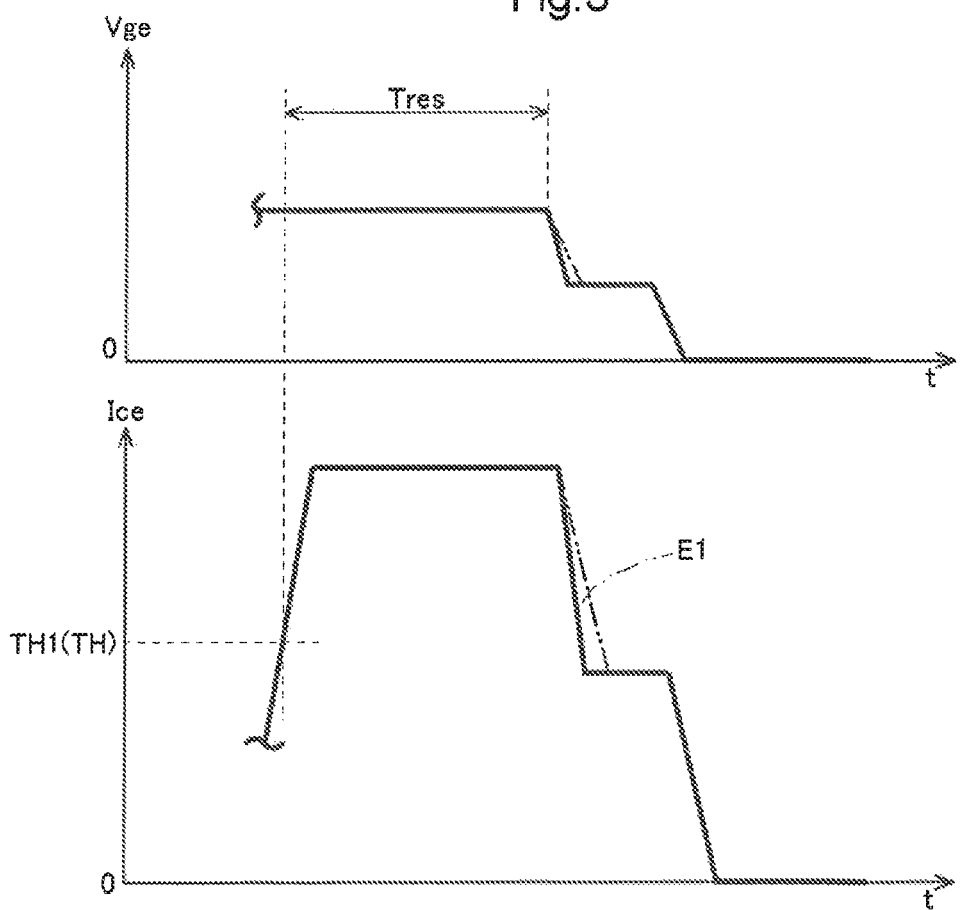
FIG. 3 includes waveform charts schematically illustrating examples of the gate voltage and the element current at the time of turn-off.

The waveform charts of FIG. 3 schematically illustrate an example of the gate voltage Vge and the element current (Ice) at the time of turn-off. The upper chart indicates the gate voltage Vge (gate-emitter voltage). The lower charge indicates the element current (collector-emitter current Ice) of the switching element 3. When the element current (Ice) is increased to exceed an overcurrent threshold TH (first overcurrent threshold TH1), the gate voltage Vge starts lowering after the lapse of the detection time by the overcurrent detection circuit 26 and a response time Tres required to output a drive signal from the SOFT terminal. In the case where the soft turn-off circuit 23 does not include the capacitor Cs, the gate voltage Vge is lowered and the element current (Ice) is also lowered in a following manner as indicated by the virtual lines in FIG. 3. In the case where the soft turn-off circuit 23 includes the capacitor Cs, the gate voltage Vge is lowered and the element current (Ice) is also lowered in a following manner as indicated by the solid lines in FIG. 3. A region "E1" surrounded by the virtual line and the solid line indicates the energy (loss, heat) reduced when the soft turn-off circuit 23 includes the capacitor Cs.

In the case where the switching element 3 is an IGBT, the gate voltage Vge is varied stepwise as indicated in FIG. 3 because of the element structure. The capacitor Cs at least shortens the time before the gate voltage Vge reaches a middle value of the step shape. Even if the capacitor Cs is provided, the element current (Ice) is not reduced to zero at one stroke, and thus a surge voltage generated between the collector and the emitter of the switching element 3 is suppressed.

As described above with reference to FIGS. 1 to 3, the inverter device 1, which includes the inverter circuit 10 which converts power between DC power and multi-phase AC power, includes: the drive circuit 20 which transfers a drive signal to each of the plurality of switching elements 3 which constitute the inverter circuit 10; and the current detection circuit (shunt resistor Rc) which detects a current that flows through each of the switching elements 3. The drive circuit 20 causes the switching element 3 to perform turn-on, in which the switching element 3 is caused to transition from the off state to the on state, and turn-off, in which the switching element 3 is caused to transition from the on state to the off state, by transferring a drive signal. In addition, the drive circuit 20 includes the soft turn-off circuit 23 which causes the switching element 3 to perform the turn-off by transferring the drive signal via the delay resistor Rs in the case where the current which is detected by the current detection circuit (shunt resistor Rc) is equal to or more than an overcurrent threshold (e.g. TH1) prescribed in advance. The soft turn-off circuit 23 further includes the capacitor Cs which is connected in parallel with the delay resistor Rs.

As discussed above, the capacitor Cs is provided to discharge the gate charge. Therefore, the capacitor Cs preferably has a capacitance that matches the gate charge. As discussed above with reference to FIG. 3, the element current (Ice) can be immediately reduced by shortening the transition time of the gate voltage Vge, which is varied stepwise, for the first step (former half) while making use of the soft turn-off. The gate voltage Vge is generally varied in two steps, by about half the amount of variation per each step. Thus, the capacitor Cs preferably has a capacitance that allows about half the amount of charge (Qg) in the gate terminal G to be discharged at maximum.

Specifically, when the charge amount of the gate terminal G (control terminal) at the time of the turn-on of the switching element 3 is defined as "Qg", the control terminal voltage to be applied to the gate terminal G at the time of the turn-on of the switching element 3 is defined as "Vge", and the capacitance of the capacitor Cs is defined as "Cs", the capacitance of the capacitor Cs is preferably set so as to meet the relationship "Cs≤(Qg/2)/Vge". In other words, the capacitance of the capacitor Cs is preferably set to be equal to or less than half the parasitic capacitance of the gate terminal G which is based on the charge amount Qg of the gate terminal G at the time of the turn-on of the switching element 3 and the control terminal voltage (gate voltage Vge) to be applied to the gate terminal G at the time of the turn-on of the switching element 3.

Figure 4:
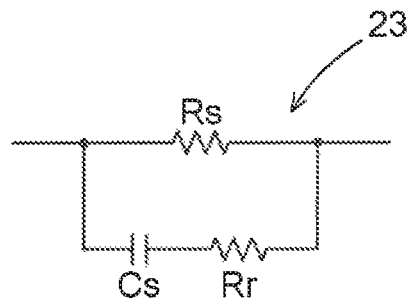
FIG. 4 is a circuit diagram schematically illustrating another example of a soft turn-off circuit.

In order to suppress an in-rush current that flows into the capacitor Cs, and in order to suppress hunting of the gate voltage Vge which is caused when the gate voltage Vge is abruptly lowered, the soft turn-off circuit 23 preferably includes a limiting resistor Rf connected in series with the capacitor Cs as illustrated in FIG. 4. The limiting resistor Rr has a resistance value that is smaller than that of the delay resistor Rs.

As discussed above, the contactor 9 is brought into a connected state when an ignition key (IG key) of the vehicle is in an on state (effective state), and brought into a disconnected state when the IG key is in an off state (ineffective state). During normal operation, the open/close state of the contactor 9 is controlled in accordance with the state of the IG key. However, the contactor 9 may be brought into the disconnected state by a failure of the electric system, a significant impact on the vehicle, or the like when the IG key is in the on state. For example, the contactor 9 may be brought into the disconnected state in the case where power supply to the contactor 9 is blocked, in the case where a failure is caused in a drive circuit for the contactor 9, in the case where a wire break is caused in a circuit around the contactor 9, in the case where the contactor 9 is mechanically moved by vibration, an impact, or the like. When the contactor 9 is brought into the disconnected state, power supply from the high-voltage battery 11 to the inverter circuit 10 side is blocked. Similarly, regeneration of power supplied from the rotary electric machine 80 to the high-voltage battery 11 via the inverter circuit 10 is also blocked by the contactor 9.

When the rotary electric machine 80 is rotating at this time, the rotary electric machine 80 continues rotating because of the inertia. Power accumulated in the stator coils 8 charges the DC link capacitor 4 via the inverter circuit 10, which occasionally raises the terminal voltage (DC link voltage Vdc) of the DC link capacitor 4 in a short time. Increasing the DC link capacitor 4 in capacitance and withstanding voltage in preparation for a rise in DC link voltage Vdc leads to an increase in size of the capacitor. In addition, it is also necessary to increase the inverter circuit 10 in withstanding voltage. As a result, a reduction in size of the inverter device 1 is hindered, and the component cost, the manufacturing cost, and the product cost are also affected.

Therefore, in the case where the contactor 9 is brought into the disconnected state, one of upper active short circuit control, in which the upper switching elements 31 of the arms 30 for all the multiple phases (here, three phases) are controlled to the on state, and lower active short circuit control, in which the lower switching elements 32 of the arms 30 for all the multiple phases (three phases) are controlled to the on state, is occasionally executed. When the active short circuit control is executed, power accumulated in the stator coils 8 is circulated between the stator coils 8 and the switching elements 3 of the inverter circuit 10. Energy of the current (circulating current) is consumed as heat or the like in the switching elements 3, the stator coils 8, etc.

A circulating current that flows in the case where the active short circuit control is executed occasionally becomes larger than the first overcurrent threshold TH1 indicated with reference to FIG. 3. In such a case, an overcurrent protection function of the drive circuit 20 acts to turn off the switching element 3, which has been controlled to the on state because of the active short circuit control, even if the active short circuit control is executed. As measures against such an issue, it is conceivable to set the overcurrent threshold to a second overcurrent threshold TH2 that is larger than the first overcurrent threshold TH1 and the maximum value (Iasc), which is determined by the specifications, of the circulating current (see FIGS. 5 and 6).

FIG. 6 indicates an example of the gate voltage Vge and the element current (Ice) for a case where the overcurrent threshold is set to the second overcurrent threshold TH2. FIG. 6 corresponds to a comparative example of FIG. 5 to be discussed later, and indicates the characteristics for a case where the soft turn-off circuit 23 does not include the capacitor Cs which is connected in parallel with the delay resistor Rs.

Figure 5:
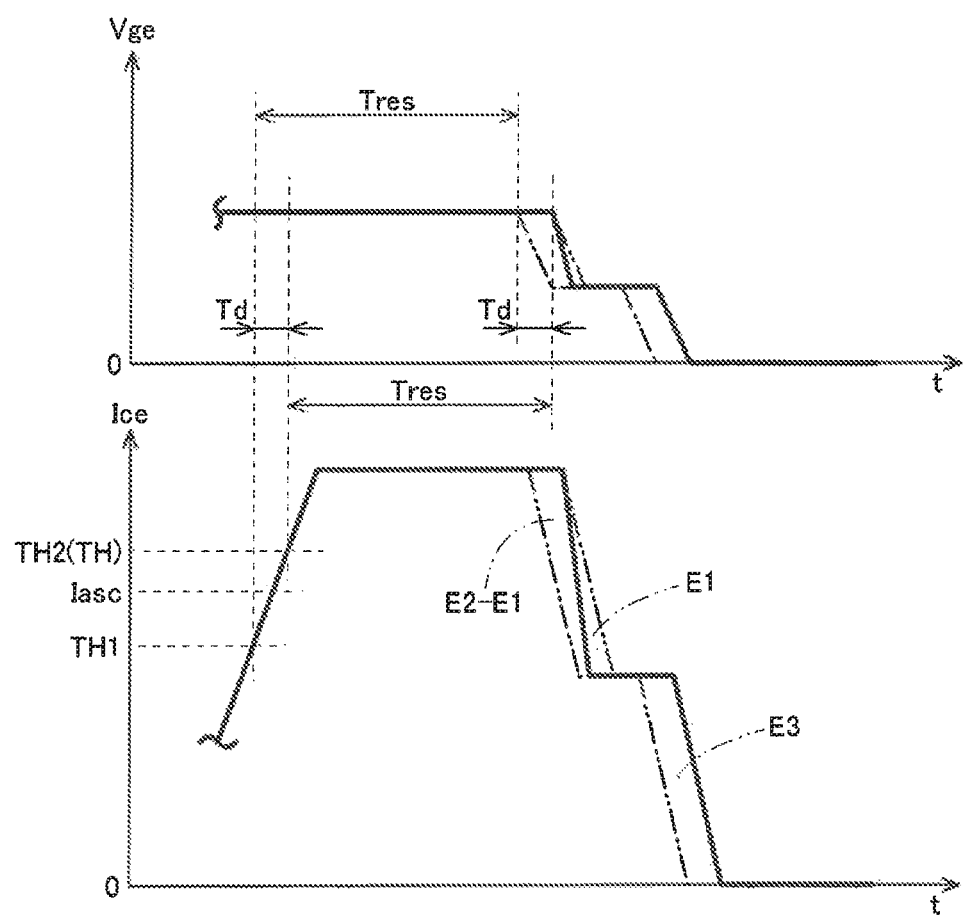
FIG. 5 includes waveform charts schematically illustrating an example of the gate voltage and the element current at the time of turn-off.

The waveform charts of FIGS. 5 and 6 schematically illustrate an example of the gate voltage Vge and the element current (Ice) at the time of turn-off. FIG. 5 indicates an example of the characteristics for a case where the soft turn-off circuit 23 includes the capacitor Cs which is connected in parallel with the delay resistor Rs as illustrated in FIG. 2. FIG. 6 corresponds to a comparative example of FIG. 5, and indicates the characteristics for a case where the soft turn-off circuit 23 does not include the capacitor Cs which is connected in parallel with the delay resistor Rs.

As illustrated in FIGS. 5 and 6, when the overcurrent threshold is changed from the first overcurrent threshold TH1 to the second overcurrent threshold TH2 which is larger than "TH1", the time when an overcurrent is detected is delayed by a detection delay time Td. As a matter of course, the time when the response time Tres elapses is also delayed by the detection delay time Td. As a result, as illustrated in FIGS. 5 and 6, the time when the gate voltage Vge starts lowering is also delayed, and the time when the element current (Ice) starts reducing is also delayed. In the case where the soft turn-off circuit 23 does not include the capacitor Cs, as indicated in FIG. 6, the energy (loss, heat) due to the element current (Ice) is increased by "E2" and "E3" in the case where the overcurrent threshold TH is "TH2" compared to a case where the overcurrent threshold TH is "TH1.".

In the case where the soft turn-off circuit 23 includes the capacitor Cs, however, as discussed above with reference to FIG. 3, the capacitor Cs discharges the charge of the gate terminal G during the turn-off. Consequently, as indicated in FIG. 5, at least the time before the gate voltage Vge reaches a middle value of the step shape is shortened. In the comparative example illustrated in FIG. 6, the energy (loss, heat) is increased by "E2" in the case where the overcurrent threshold. TH is "TH2", compared to a case where the overcurrent threshold TH is "TH1", before the element current (Ice) is reduced to a middle value. However, the energy can be reduced from "E2" by "E1" as indicated in FIG. 5 by discharging the charge of the gate terminal G using the capacitor Cs.

As discussed above with reference to FIG. 3, the capacitance of the capacitor Cs is set to an appropriate value such that the element current (Ice) is not reduced to zero at one stroke. Thus, the function of the soft turn-off is maintained even if the transition time during the turn-off is shortened, which suppresses a surge voltage generated between the collector and the emitter of the switching element 3. Therefore, the energy (loss, heat) consumed when the element current (Ice) is reduced from a middle value to zero is substantially the same between the case where the soft turn-off circuit 23 includes the capacitor Cs (FIG. 5) and the case where the soft turn-off circuit 23 does not include the capacitor Cs (FIG. 6), and is "E3" in both the cases. Thus, the energy (loss, heat) is increased by "E2−E1+E3" by increasing the overcurrent threshold from "TH1" to "TH2".

In this way, an increase in energy (loss, heat) can be suppressed by the capacitor Cs. Thus, the overcurrent threshold TH is preferably set in accordance with a current (Iasc) that flows through the switching element 3 which is controlled to the on state when the inverter circuit 10 is in the active short circuit state (to be discussed later). That is, as discussed above, the overcurrent threshold TH is preferably set to the second overcurrent threshold TH2 which is larger than the maximum value (Iasc), which is determined by the specifications, of the circulating current which flows when the inverter circuit 10 is in the active short circuit state. In the case where the first overcurrent threshold TH1 is larger than the maximum value (Iasc), which is determined by the specifications, of the circulating current, the second overcurrent threshold TH2 may be equal to or less than the first overcurrent threshold TH1. In this case, the overcurrent threshold TH is set to the first overcurrent threshold TH1.

It should be noted, however, that in the active short circuit state, as discussed above, the circulating current is circulated between the stator coils 8 of the rotary electric machine 80 and the switching elements 3 of the inverter circuit 10, and that the energy of the circulating current is consumed as heat by the stator coils 8 and the inverter circuit 10. Thus, the overcurrent threshold TH is not hindered from being set to a value that is smaller than the maximum value (Iasc), which is determined by the specifications, of the circulating current in consideration of the heat resistance of the stator coils 8 and the inverter circuit 10 etc. For example, the DC link capacitor 4 is occasionally separately provided with a discharge circuit. In such a case, charge of the DC link capacitor 4 and the active short circuit control may be executed in combination.

For example, when the switching element 3 is turned off with the circulating current exceeding the overcurrent threshold TH when the active short circuit control is started, the energy which is accumulated in the stator coils 8 charges the DC link capacitor 4. Then, the active short circuit control may be intermittently repeated by starting the active short circuit control again when the DC link voltage Vdc is raised, for example. It is conceivable that the circulating current for the second and subsequent active short circuit control is reduced compared to that for the first active short circuit control. Thus, it is possible that the second and subsequent active short circuit control can be executed continuously. In the case where such control can be performed, the overcurrent threshold TH may be set to a value that is smaller than the maximum value (Iasc), which is determined by the specifications, of the circulating current. The overcurrent threshold TH is preferably set in accordance with the circulating current (Iasc), whether the overcurrent threshold TH is larger or smaller than the circulating current (Iasc).

The wording "the inverter circuit 10 is in the active short circuit state" refers to a state in which one of the upper active short circuit control and the lower active short circuit control is executed on the inverter circuit 10. Thus, the wording "the inverter circuit 10 is in the active short circuit state" refers to both a state in which the upper switching elements 31 of the arms 30 for all the multiple phases are controlled to the on state (upper active short circuit state) and a state in which the lower switching elements 32 of the arms 30 for all the multiple phases are controlled to the on state (lower active short circuit state).

The embodiment disclosed herein is merely illustrative in all respects. Thus, a variety of alterations can be made, as appropriate, without departing from the scope and spirit of the present disclosure.

OVERVIEW OF EMBODIMENT

The overview of the inverter device (1) described above will be briefly described below.

An aspect provides an inverter device (1) that includes an inverter circuit (10) that converts power between DC power and multi-phase AC power, including:

a drive circuit (20) that transfers a drive signal to each of a plurality of switching elements (3) that constitute the inverter circuit (10) to cause the switching element (3) to perform turn-on, in which the switching element (3) is caused to transition from an off state to an on state, and turn-off, in which the switching element (3) is caused to transition from the on state to the off state; and a current detection circuit (26) that detects a current that flows through each of the switching elements (3), in which:

the drive circuit (20) includes a soft turn-off circuit (23) that causes the switching element (3) to perform the turn-off by transferring the drive signal via a delay resistor (Rs) in the case where the current which is detected by the current detection circuit (26) is equal to or more than an overcurrent threshold (TH) prescribed in advance; and the soft turn-off circuit (23) includes a capacitor (Cs) connected in parallel with the delay resistor (Rs).

According to this configuration, in which the soft turn-off circuit (23) is provided, the magnitude of a surge voltage generated in the switching elements (3) when the switching elements (3) are turned off along with generation of an overcurrent can be suppressed. With the soft turn-off circuit (23) provided with the capacitor (Cs), in addition, a charge accumulated in the stray capacitance of the switching elements (3) can be discharged by the capacitor (Cs) during the turn-off. That is, the drive signal for the switching elements (3) can be caused to transition immediately by the action of the capacitor (Cs) in the initial stage of the transition while allowing the drive signal to transition slowly because of the delay resistor (Rs) of the soft turn-off circuit (23). In the initial stage of the transition, a large current flows through the switching elements (3). Thus, the energy (loss, heat) due to the current which flows through the switching elements (3) can be reduced by causing the drive signal to transition immediately. According to the present configuration, in this way, a loss caused by the switching elements (3) when the switching elements (3) are turned off along with generation of an overcurrent can be reduced.

In one preferable aspect, when a charge amount of a control terminal (G) at the time of the turn-on of the switching element (3) is defined as Qg, a control terminal voltage to be applied to the control terminal (G) at the time of the turn-on of the switching element (3) is defined as Vge, and a capacitance of the capacitor (Cs) is defined as Cs, the capacitance of the capacitor (Cs) is set so as to meet $$Cs \leq (Qg/2)/Vge$$

The control terminal (G) of the switching element (3) has a stray capacitance. During the turn-on, for example, variations in voltage of the control terminal (G) are delayed in accordance with the time for charging the stray capacitance, even if a drive signal is provided to the control terminal (G). During the turn-off, it is necessary to discharge the charge in the stray capacitance, and variations in voltage of the control terminal (G) are delayed in accordance with the time for charging the stray capacitance. In order to suppress the delay in variations in voltage of the control terminal (G) during the turn-off, it is only necessary to discharge the charge in the control terminal (G). If too much charge is discharged, however, the effect of adjusting the transition time for the turn-off by providing the soft turn-off circuit (23) is reduced, and it is difficult to suppress a surge voltage generated in the switching elements (3) during the turn-off. A current that flows through the switching elements (3) is substantially proportional to the voltage of the control terminal (G). Thus, the effect of reducing such a current is increased if the transition speed in the former half of the transition period of the voltage of the control terminal (G) is increased. Thus, it is generally sufficient to discharge an amount of charge when the turn-off is started, the amount being equal to or less than about half the charge amount Qg of the control terminal (G). Thus, the capacitance of the capacitor (Cs) is preferably set by the above formula. Consequently, the current (Ice) which flows through the switching elements (3) can be immediately reduced while making use of the soft turn-off.

In one preferable aspect, in addition, the inverter circuit (10) is connected to an AC rotary electric machine (80) and a DC power source (11) to convert power between the multi-phase AC power and the DC power, and includes a plurality of arms (30), each of which corresponds to one of phases of the AC power and is constituted of a series circuit that includes an upper switching element (31) and a lower switching element (32); and the overcurrent threshold (TH) is set in accordance with a current (Iasc) that flows through the switching element (3) which is controlled to the on state in an active short circuit state, which is one of a state in which the upper switching elements (31) of the arms (30) for all the multiple phases are controlled to the on state and a state in which the lower switching elements (32) of the arms (30) for all the multiple phases are controlled to the on state.

In the case where the inverter circuit (10) is in the active short circuit state, the energy which is accumulated in the stator coils (8) of the rotary electric machine (80) is circulated between the stator coils (8) and the inverter circuit (10). Thus, a significantly large current may be circulated depending on the state (such as the rotational speed) of the rotary electric machine (80) at the time when the inverter circuit (10) is brought into the active short circuit state. In the case where the magnitude of the current is larger than the overcurrent threshold (TH), a protection function may act to turn off the switching elements (3), and the active short circuit state may be canceled. Thus, the overcurrent threshold is preferably set such that the active short circuit state is not hindered and appropriate overcurrent protection is enabled in the case where the active short circuit state is required. For example, in the case where a current (Ice) that exceeds the overcurrent threshold (TH) flows when the active short circuit state is required, the switching elements (3) are appropriately turned off by an overcurrent protection function. Since the overcurrent threshold (TH) is set in accordance with the current (Iasc) which flows through the switching elements (3) which are controlled to the on state in the active short circuit state, however, the timing when the turn-off is achieved is delayed. Thus, the active short circuit state is appropriately continued when the current (Ice) which flows through the switching elements (3) is within an allowable range.

Preferably, the soft turn-off circuit (23) includes a resistor (Rr) that has a resistance value that is smaller than that of the delay resistor (Rs) and that is connected in series with the capacitor (Cs).

During the turn-off, an in-rush current may flow into the capacitor (Cs), or the voltage of the control terminal (G) may be abruptly lowered to cause hunting of the voltage of the control terminal (G). In order to suppress such an in-rush current and hunting, the resistor (Rr) which limits a current that flows into the capacitor (Cs) is preferably provided.

The invention claimed is:

1. An inverter device comprising:
an inverter circuit that converts power between DC power and multi-phase AC power;

a drive circuit that transfers a drive signal to each of a plurality of switching elements that form the inverter circuit to cause a switching element of the plurality of switching elements to perform turn-on, in which the switching element is caused to transition from an off state to an on state, and turn-off, in which the switching element is caused to transition from the on state to the off state;

a current detection circuit that detects a current that flows through each of the plurality of switching elements; and an electronic control unit, wherein:
  the drive circuit includes a soft turn-off circuit that causes the switching element to perform the turn-off by transferring the drive signal via a delay resistor in the case where the current which is detected by the current detection circuit is equal to or more than an overcurrent threshold prescribed in advance;
  the soft turn-off circuit includes a capacitor connected in parallel with the delay resistor;
  the inverter circuit is connected to an AC rotary electric machine and a DC power source to convert power between the multi-phase AC power and the DC power, and includes a plurality of arms, each of which corresponds to one of phases of the AC power and is formed of a series circuit that includes an upper switching element and a lower switching element;
  the electronic control unit is configured to set the overcurrent threshold to a value larger than a maximum current that flows through the switching element which is controlled to the on state when the inverter circuit is in an active short circuit state, which is one of a state in which the upper switching elements of the arms for all the multiple phases are controlled to the on state and a state in which the lower switching elements of the arms for all the multiple phases are controlled to the on state; and
  the electronic control unit is configured to set the overcurrent threshold to a value smaller than the maximum current that flows through the switching element which is controlled to the on state when the inverter circuit is not in the active short circuit state.

2. The inverter device according to claim 1, wherein
when a charge amount of a control terminal at the time of the turn-on of the switching element is defined as Qg, a control terminal voltage to be applied to the control terminal at the time of the turn-on of the switching element is defined as Vge, and a capacitance of the capacitor is defined as Cs, the capacitance of the capacitor is set so as to meet $$Cs \leq (Qg/2)/Vge.$$

3. The inverter device according to claim 2, wherein
the soft turn-off circuit includes a resistor that has a resistance value that is smaller than that of the delay resistor and that is connected in series with the capacitor.

4. The inverter device according to claim 1, wherein
the soft turn-off circuit includes a resistor that has a resistance value that is smaller than that of the delay resistor and that is connected in series with the capacitor.

* * * * *